US009721884B2

(12) United States Patent
Horikawa et al.

(10) Patent No.: US 9,721,884 B2
(45) Date of Patent: Aug. 1, 2017

(54) INDUCTOR DEVICE AND METHOD OF MANUFACTURING THE SAME

(71) Applicant: SHINKO ELECTRIC INDUSTRIES CO., LTD., Nagano-shi, Nagano (JP)

(72) Inventors: Yasuyoshi Horikawa, Nagano (JP); Tsukasa Nakanishi, Nagano (JP); Tatsuaki Denda, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/332,611

(22) Filed: Oct. 24, 2016

(65) Prior Publication Data

US 2017/0117219 A1 Apr. 27, 2017

(30) Foreign Application Priority Data

Oct. 27, 2015 (JP) ................. 2015-210439

(51) Int. Cl.
*H01L 29/00* (2006.01)
*H01L 23/522* (2006.01)
*H01L 23/528* (2006.01)

(52) U.S. Cl.
CPC ...... *H01L 23/5227* (2013.01); *H01L 23/5226* (2013.01); *H01L 23/5283* (2013.01)

(58) Field of Classification Search
CPC ...................................................... H01L 21/02
See application file for complete search history.

(56) References Cited

U.S. PATENT DOCUMENTS 6,133,079 A * 10/2000 Zhu ...................... H01L 23/5227
257/E21.022

FOREIGN PATENT DOCUMENTS

| JP | 06-104546 | 4/1994 |
| JP | 2015-032625 | 2/2015 |
| JP | 2015-032626 | 2/2015 |
| JP | 2015-076597 | 4/2015 |

* cited by examiner

*Primary Examiner* — Samuel Gebremariam
(74) *Attorney, Agent, or Firm* — Rankin, Hill & Clark LLP

(57) ABSTRACT

An inductor device includes a first insulating layer having a first via hole, a first metal layer formed on an upper surface of the first insulating layer and having a droop portion at an upper end-side of the first via hole, a second metal layer formed on a lower surface of the first insulating layer and having a first connection part exposed to a bottom surface of the first via hole, and a first metal-plated layer formed in the first via hole and configured to connect the first connection part and the droop portion of the first metal layer.

8 Claims, 15 Drawing Sheets

(PARTIALLY ENLARGED SECTIONAL VIEW)

INDUCTOR DEVICE AND METHOD OF MANUFACTURING THE SAME

CROSS-REFERENCE TO RELATED APPLICATION

The present application claims priority from Japanese Patent Application No. 2015-210439 filed on Oct. 27, 2015, the entire content of which is incorporated herein by reference.

BACKGROUND

Technical Field

The disclosure relates to an inductor device and a method of manufacturing the same.

Related Art

In the related art, an inductor device that is to be used for a high-frequency circuit and the like of a variety of electronic devices has been known. A structure of the inductor device includes a wire winding type where an electric wire is wound, a plane type where a coil conductor having a spiral shape is formed on a plane, and the like.

[Patent Document 1] Japanese Patent Application Publication No. 2015-32625A

[Patent Document 2] Japanese Patent Application Publication No. 2015-32626A

[Patent Document 3] Japanese Patent Application Publication No. 2015-76597A

As described later in paragraphs of preliminary matters, in the inductor device, metal layers made of copper foils and formed on both surfaces of an insulating layer are connected to each other via a metal-plated layer formed in via holes of the insulating layer.

In the via structure, when thermal stress is generated, the stress is likely to be concentrated on the part of the insulating layer at an upper end of the via hole. For this reason, a crack is likely to be generated in the insulating layer and sufficient reliability of the via connection is not obtained.

SUMMARY

Exemplary embodiments of the invention provide a new structure for securing high reliability of via connection in an inductor device where upper and lower metal layers are connected to each other via a metal-plated layer in via holes and a method of manufacturing the same.

An inductor device according to an exemplary embodiment, comprises:

a first insulating layer having a first via hole;

a first metal layer formed on an upper surface of the first insulating layer and having a droop portion at an upper end-side of the first via hole;

a second metal layer formed on a lower surface of the first insulating layer and having a first connection part exposed to a bottom surface of the first via hole; and a first metal-plated layer formed in the first via hole and configured to connect the first connection part and the droop portion of the first metal layer.

A method of manufacturing an inductor device, according to an exemplary embodiment, comprises:

preparing a stacked base material having a first metal layer and a first insulating layer formed on a lower surface of the first metal layer;

punching the stacked base material by a punch to form a first via hole in the first insulating layer and to obtain a droop portion of the first metal layer at an upper end-side of the first via hole;

forming a second metal layer having a first connection part exposed to a bottom surface of the first via hole, on a lower surface of the first insulating layer; and forming a first metal-plated layer configured to connect the first connection part and the droop portion of the first metal layer in the first via hole by an electrolytic plating where the second metal layer is used as a power feeding path for plating.

According to the below disclosure, in the inductor device, the first metal layer having the droop portion at the upper end-side of the first via hole is formed on the upper surface of the first insulating layer having the first via hole. Also, the second metal layer having the first connection part exposed to the bottom surface of the first via hole is formed on the lower surface of the first insulating layer.

In the first via hole, the first metal-plated layer configured to connect the first connection part and the droop portion of the first metal layer is formed.

By adopting the via structure, even when thermal stress is generated, the stress to be concentrated on the part of the first insulating layer at the upper end of the first via hole is relieved, so that it is possible to prevent a crack from being generated from the upper end of the first via hole into the first insulating layer.

Thereby, it is possible to improve the reliability of the via connection of the upper and lower metal layers of the inductor device.

DETAILED DESCRIPTION

Hereinafter, exemplary embodiments will be described with reference to the accompanying drawings.

Before describing the exemplary embodiments, preliminary matters, which are bases of the disclosure, are first described. It should be noted that the preliminary matters include personal investigation contents of the inventors and are not a known technology.

FIGS. 1A to 2B illustrate a problem of an inductor device relating to the preliminary matters.

Figure 1A:
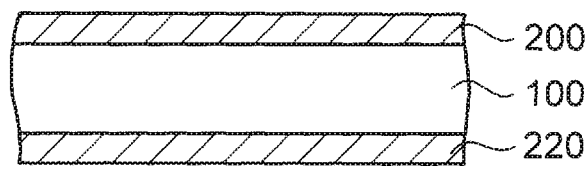
FIGS. 1A to 1C are sectional views for illustrating a problem of an inductor device relating to preliminary matters (1 thereof).

As shown in FIG. 1A, in a manufacturing method of an inductor device relating to the preliminary matters, an insulating layer 100 having a metal layer 200 formed on an upper surface and a metal layer 220 formed on a lower surface is first prepared. The metal layers 200, 220 are patterned at necessary timings and function as coils.

Figure 1B:
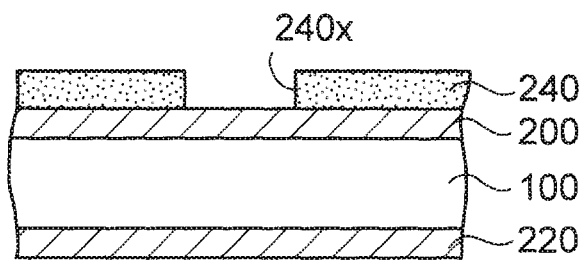

Then, as shown in FIG. 1B, a resist layer 240 having hole-shaped openings 240x is formed on the metal layer 200.

Figure 1C:
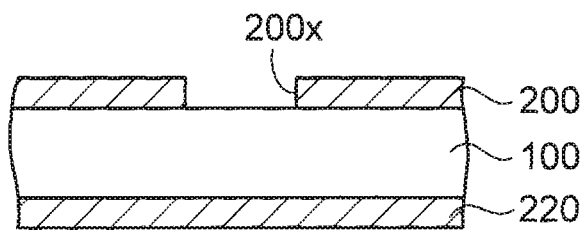

Subsequently, as shown in FIG. 1C, the metal layer 200 is wet-etched through the openings 240x of the resist layer 240. Thereafter, the resist layer 240 is removed. Thereby, the metal layer 200 is formed with openings 200x.

Figure 2A:
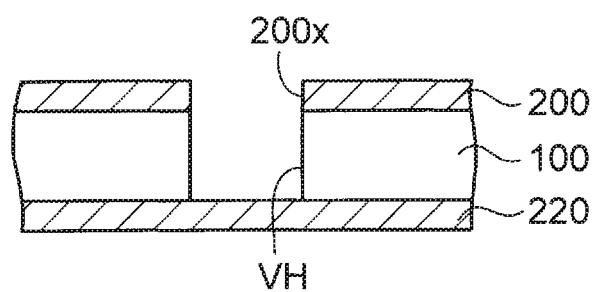
FIGS. 2A and 2B are sectional views for illustrating the problem of the inductor device relating to the preliminary matters (2 thereof).

Also, as shown in FIG. 2A, the insulating layer 100 is penetrated by laser through the openings 200x of the metal layer 200 and is thus formed with via holes VH. At this time, the metal layer 220 remains on bottoms of the via holes VH.

Alternatively, after forming the via holes VH in the insulating layer 100, the metal layer 220 may be bonded to the lower surface of the insulating layer 100.

Figure 2B:
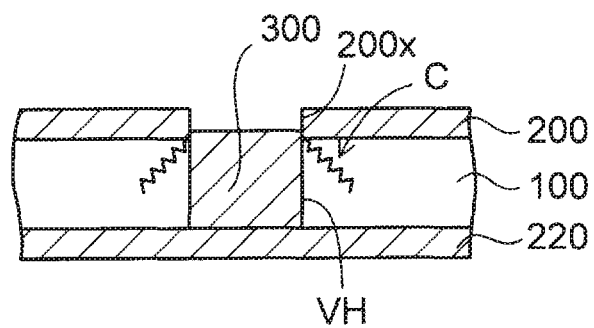

Then, as shown in FIG. 2B, a metal-plated layer 300 is formed from the bottoms of the via holes VH of the insulating layer 100 toward an upper side by an electrolytic plating where the metal layer 220 is used as a power feeding path for plating.

Thereby, the metal-plated layer 300 is connected to side surfaces of the openings 200x of the metal layer 200, and the metal layer 220 and the metal layer 200 are via-connected.

In the structure of FIG. 2B, when thermal stress is generated in a process accompanied by heating processing, for example, the stress is likely to be concentrated on the part of the insulating layer 100 at an upper end of the via hole VH. For this reason, cracks C are likely to be generated from the insulating layer 100 at the upper end of the via hole VH toward an inside, so that sufficient reliability of the via connection cannot be obtained.

Also, at a point of time at which the metal-plated layer 300 in the via hole VH is connected to a lower end of the metal layer 200, an area of the power feeding for plating sharply increases. Therefore, a current density per unit area of the electrolytic plating sharply decreases, so that a plating rate is extremely lowered and the plating is little made depending on conditions.

For this reason, the upper surface of the metal-plated layer 300 is depressed from the upper surface of the metal layer 200, so that it is not possible to easily cope with requirements for flatness of the upper surface-side.

An inductor device and a method of manufacturing the same according to exemplary embodiments, which are to be described later, can solve the above problems.

First Exemplary Embodiment

Figure 12:
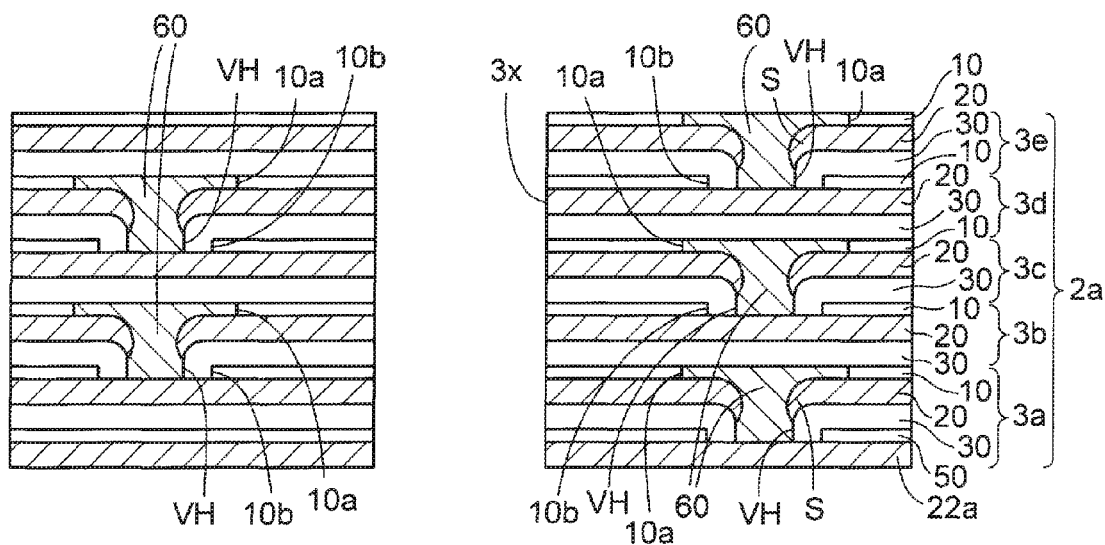
FIG. 12 is a sectional view depicting the manufacturing method of the inductor device according to the first exemplary embodiment (10 thereof).
Figure 13:
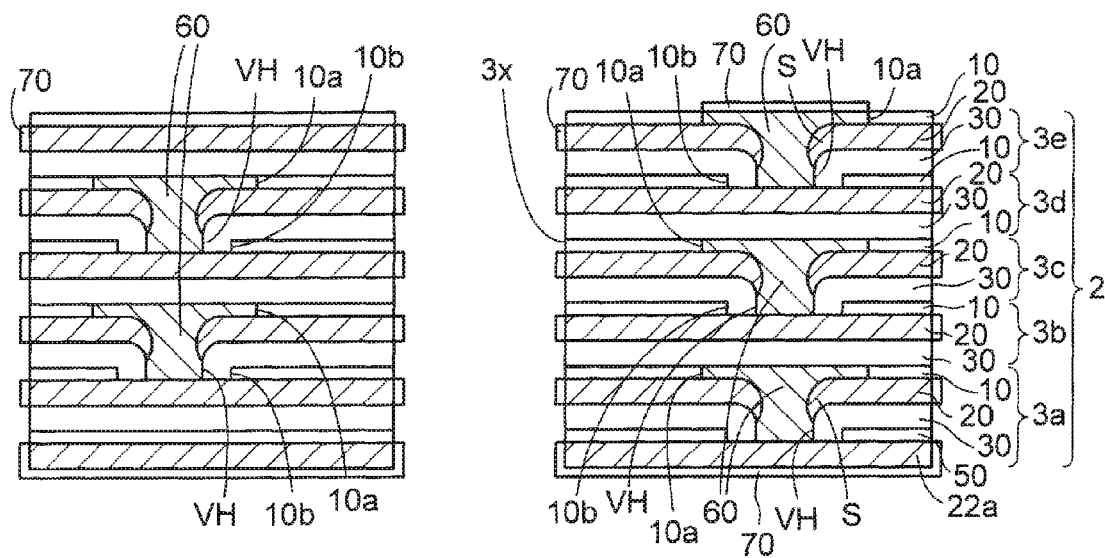
FIG. 13 is a sectional view depicting the manufacturing method of the inductor device according to the first exemplary embodiment (11 thereof).
Figure 14:
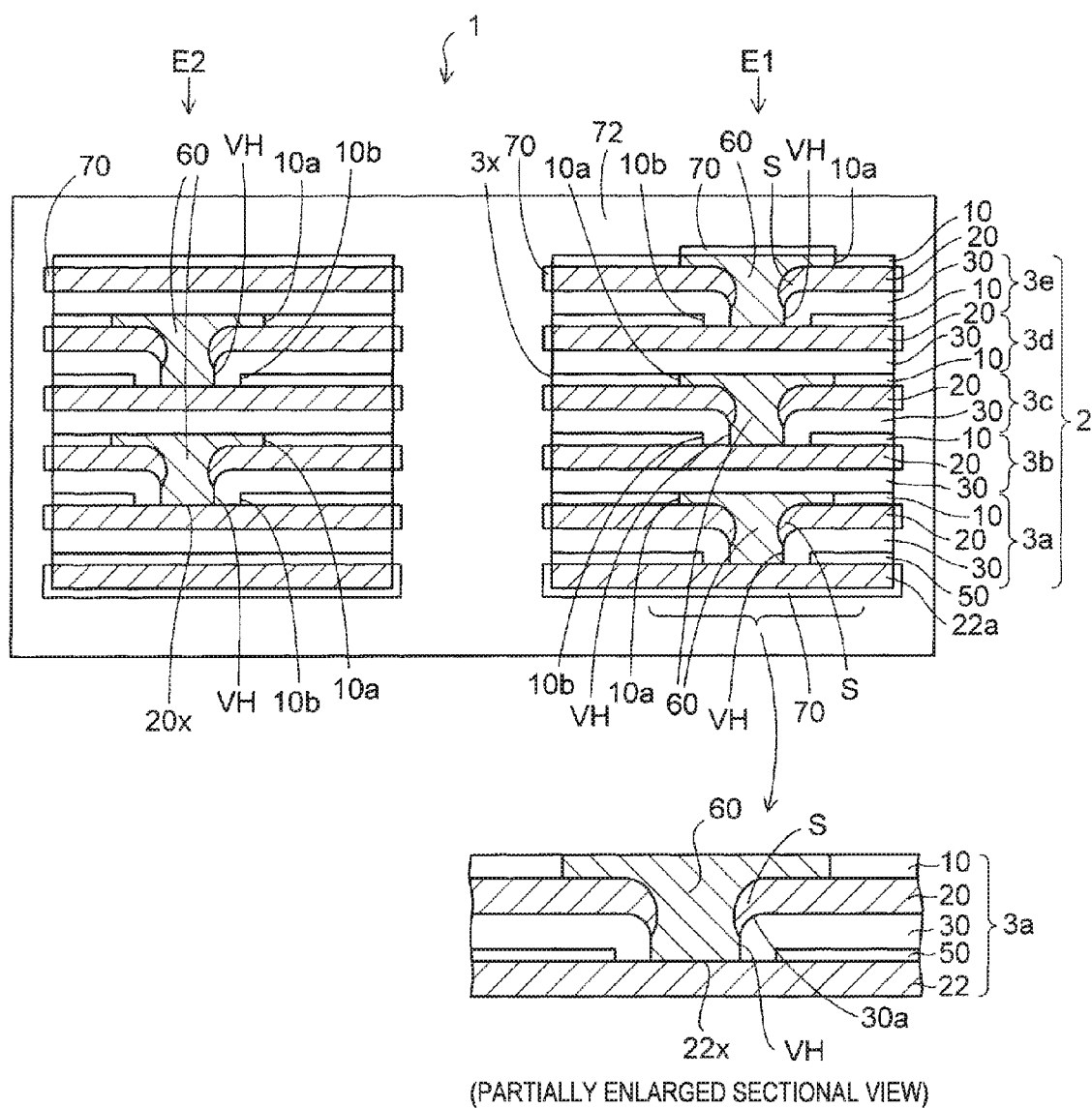
FIG. 14 is a sectional view depicting an inductor device according to the first exemplary embodiment.

FIGS. 3A to 13 depict a manufacturing method of an inductor device in accordance with a first exemplary embodiment, and FIG. 14 depicts an inductor device of the first exemplary embodiment. In the below, while describing the manufacturing method of the inductor device, a structure of the inductor device is described.

Figure 3A:
FIGS. 3A to 3D are sectional views depicting a manufacturing method of an inductor device according to a first exemplary embodiment (1 thereof).

In the manufacturing method of the inductor device of the first exemplary embodiment, a base material 5 as shown in FIG. 3A is first prepared. The base material 5 has an insulating layer 10 formed on a lower surface of a carrier film 12.

As an example of the carrier film 12, a PET film having a thickness of 25 μm to 75 μm is used. Also, as an example of the insulating layer 10, an epoxy resin sheet configured to function as an adhesive layer and having a thickness of 8 μm to 15 μm is used.

Figure 3B:

Then, as shown in FIG. 3B, the base material 5 is punched by a punch (not shown) of a mold, so that the base material 5 is formed with an opening 10a penetrating in a thickness direction.

Figure 3C:
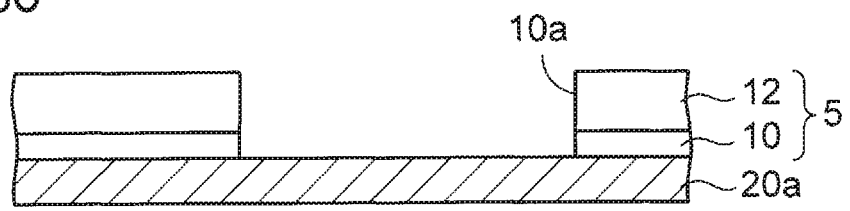

Subsequently, as shown in FIG. 3C, a metal layer 20a having a thickness of 10 μm to 35 μm is prepared, and the metal layer 20a is bonded to a lower surface-side of the carrier film 12 by the insulating layer 10. As the metal layer 20a, a copper foil is preferably used.

Figure 3D:
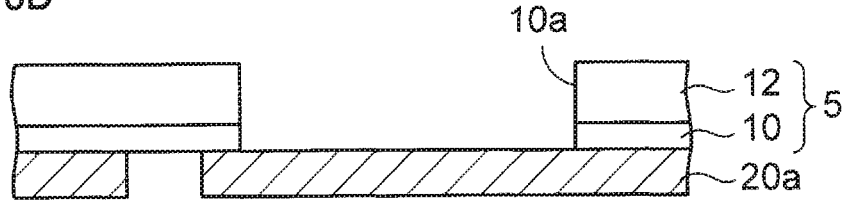

Also, as shown in FIG. 3D, a resist layer (not shown) having openings for patterning the metal layer 20a is formed on the basis of photolithography.

Also, the metal layer 20a is wet-etched through the openings of the resist layer (not shown). Thereby, the metal layer 20a is patterned into a required pattern. At this point of time, the pattern of the metal layer 20a is formed as a temporary pattern for obtaining a final coil pattern.

Figure 4A:
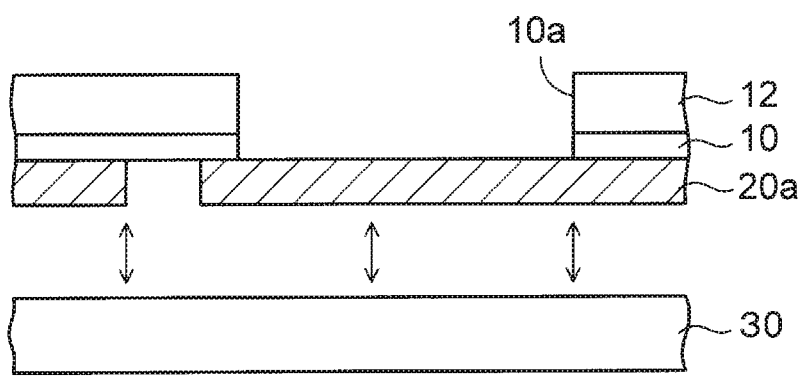
FIGS. 4A and 4B are sectional views depicting the manufacturing method of the inductor device according to the first exemplary embodiment (2 thereof).

Then, as shown in FIG. 4A, a separate insulating layer 30 is prepared. As an example of the insulating layer 30, an epoxy resin sheet configured to function as an adhesive layer and having a thickness of 5 μm to 30 μm is used. Then, the insulating layer 30 is bonded to a lower surface of the metal layer 20a of the structure shown in FIG. 3D.

Figure 4B:
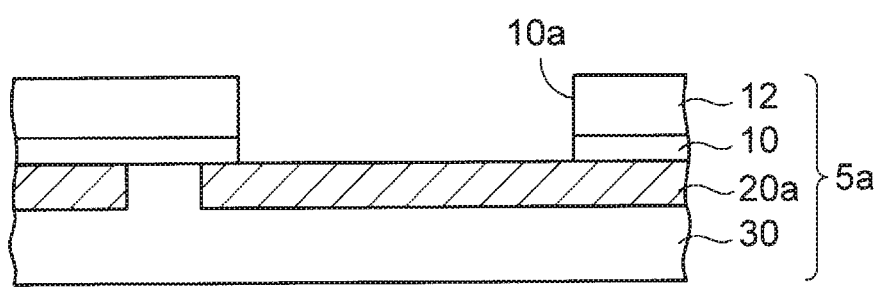

Thereby, as shown in FIG. 4B, the insulating layer 30 is formed on the lower surface of the metal layer 20a of the structure shown in FIG. 3D. The insulating layer 30 is formed with embedding steps of the pattern of the metal layer 20a, and a lower surface of the insulating layer 30 is flat.

In this way, a stacked base material 5a as shown in FIG. 4B is prepared. In the stacked base material 5a, the insulating layer 10 and the carrier film 12 are stacked in corresponding order on the metal layer 20a, and the insulating layer 30 is formed on the lower surface of the metal layer 20a.

In this way, a stacked base material having at least a structure where the insulating layer is formed on the lower surface of the metal layer is prepared.

The opening 10a formed in the carrier film 12 and the insulating layer 10 is arranged in a region in which a via hole is to be arranged later, and an upper surface of the metal layer 20a is exposed in the openings 10a.

Figure 5:
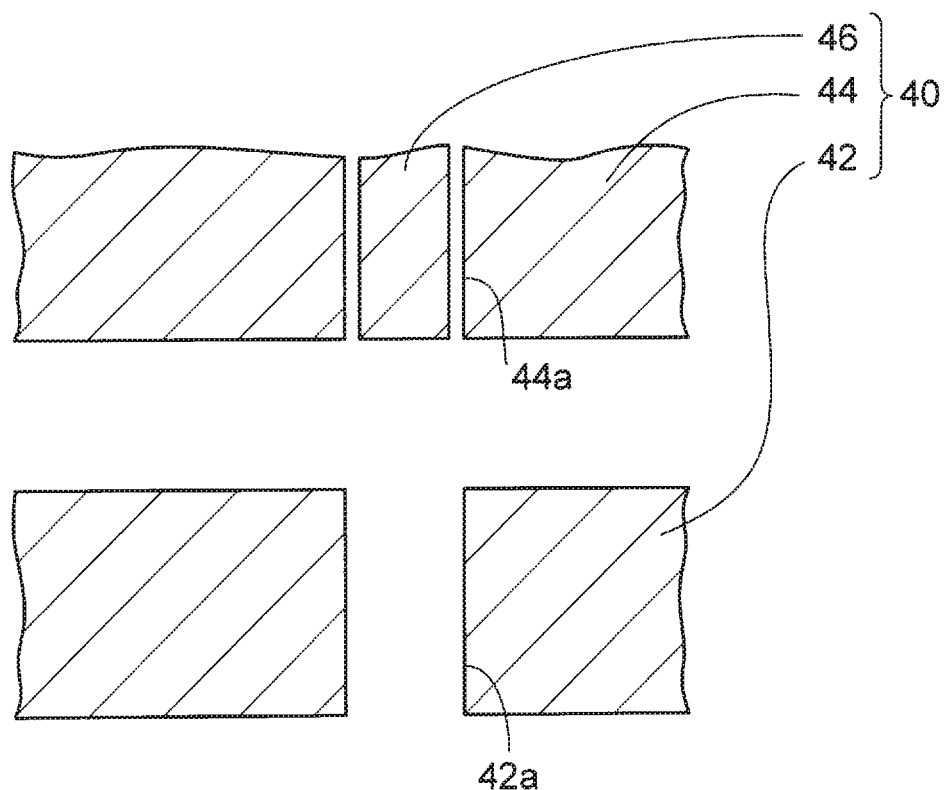
FIG. 5 is a sectional view depicting the manufacturing method of the inductor device according to the first exemplary embodiment (3 thereof).

Then, a mold 40 configured as shown in FIG. 5 is prepared. The mold 40 has a receiving member 42 for receiving a work. Also, the mold 40 has a pressing member 44 for pressing the work above the receiving member 42.

Also, the mold 40 has a punch 46 for punching the work. The punch 46 is arranged in an opening 44a of the pressing member 44. The punch 46 is connected to a moving unit (not shown), so that it can be moved vertically.

The receiving member 42 has an opening 42a in which the punch 46 is to be disposed when punching the work.

Figure 6A:
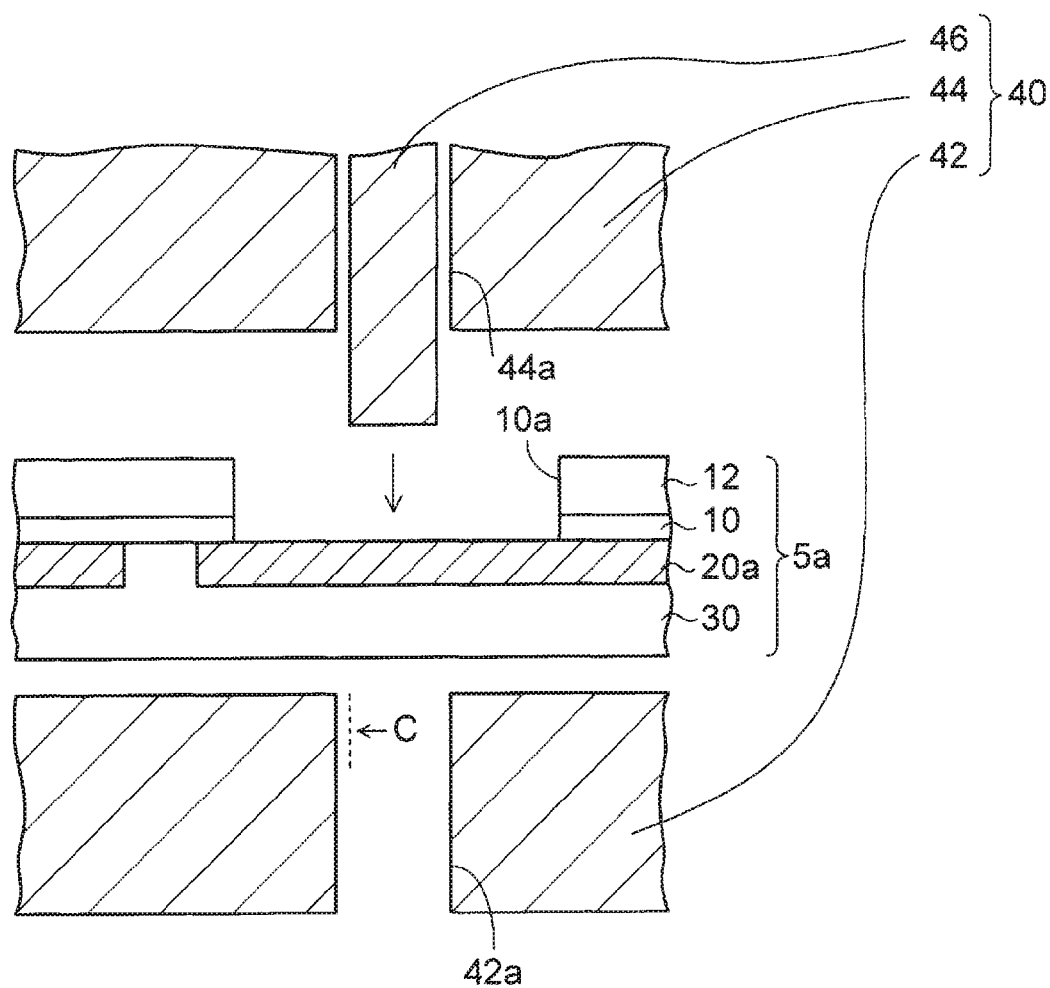
FIGS. 6A and 6B are sectional views depicting the manufacturing method of the inductor device according to the first exemplary embodiment (4 thereof).

Subsequently, as shown in FIG. 6A, the stacked base material 5a shown in FIG. 4B is conveyed and disposed between the receiving member 42 and the pressing member 44 of the mold 40.

Also, the punch 46 of the mold 40 is moved downward to punch the metal layer 20a of the bottom of the opening 10a and the insulating layer 30 of the stacked base material 5a shown in FIG. 4B in a thickness direction. Subsequently, the stacked base material 5a of FIG. 4B is conveyed outside and taken out of the mold 40.

Figure 6B:
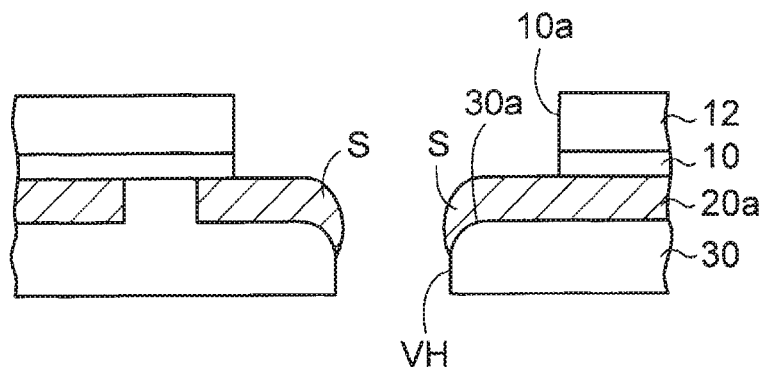

Thereby, as shown in FIG. 6B, a region ranging from the upper surface of the metal layer 20a of the stacked base material 5a to the lower surface of insulating layer 30 is penetrated, so that the insulating layer 30 is formed with a via hole VH. A diameter of the via hole VH is set to 150 µm, for example.

The metal layer 20a is pressed and punched by the punch 46 with being sandwiched and fixed between the receiving member 42 and the pressing member 44 of the mold 40.

At this time, a clearance C is formed between a side surface of the punch 46 and a side surface of the opening 42a of the receiving member 42. For this reason, when punching the metal layer 20a of the stacked base material 5a by the punch 46, a worked surface of the metal layer 20a extends downwards in the clearance C, so that droop portions S are formed at an upper end-side of the via hole VH. A size of the clearance C is set to 10 µm to 20 µm, for example.

Also, the upper end-side of the side surface of the via hole VH is formed as a convex curved surface 30a. The droop portions S of the metal layer 20a are formed to cover the convex curved surface 30a of the via hole VH.

Thereby, the opening 10a of the carrier film 12 and the insulating layer 10 is arranged above the via hole VH and on the metal layer 20a around the via hole.

Figure 7A:
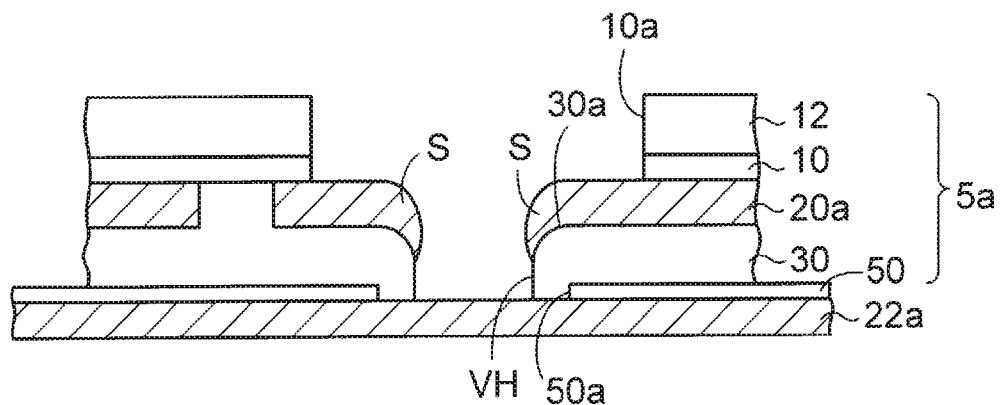
FIGS. 7A to 7C are sectional views depicting the manufacturing method of the inductor device according to the first exemplary embodiment (5 thereof).

Then, as shown in FIG. 7A, a metal layer 22a having an insulating layer 50 formed on an upper surface thereof is prepared. The metal layer 22a is formed by patterning a copper foil. The pattern of the metal layer 22a is formed as a temporary pattern for obtaining a final coil pattern, like the metal layer 20a.

The insulating layer 50 is formed with an opening 50a at a portion corresponding to the via hole VH and a surrounding region thereof of the stacked base material 5a shown in FIG. 6B.

The metal layer 22a having the insulating layer 50 formed on the upper surface thereof is obtained by preparing the same structure as shown in FIG. 3D and peeling off the carrier film 12 from the structure. Also, the insulating layer 50 is formed of an epoxy resin sheet configured to function as an adhesive layer, or the like, like the insulating layers 10, 30.

The metal layer 22a is bonded to the lower surface of the insulating layer 30 of the stacked base material 5a via the insulating layer 50. Thereby, a connection part 22x of the metal layer 22a is exposed to the bottom surface of the via hole VH of the insulating layer 30.

Figure 7B:
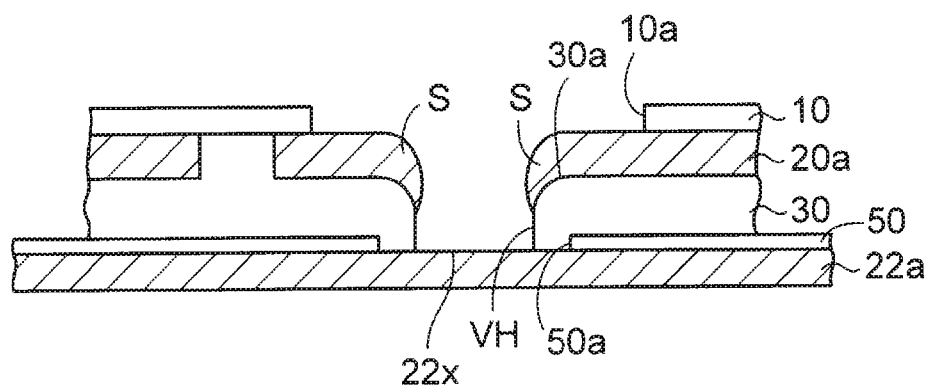

Thereafter, as shown in FIG. 7B, the carrier film 12 is peeled off from the structure of FIG. 7A, so that the upper surface of the insulating layer 10 is exposed.

At this time, the opening 10a of the insulating layer 10 is arranged above the via hole VH and the surrounding region thereof, and the metal layer 20a in the other region is covered by the insulating layer 10.

Figure 7C:
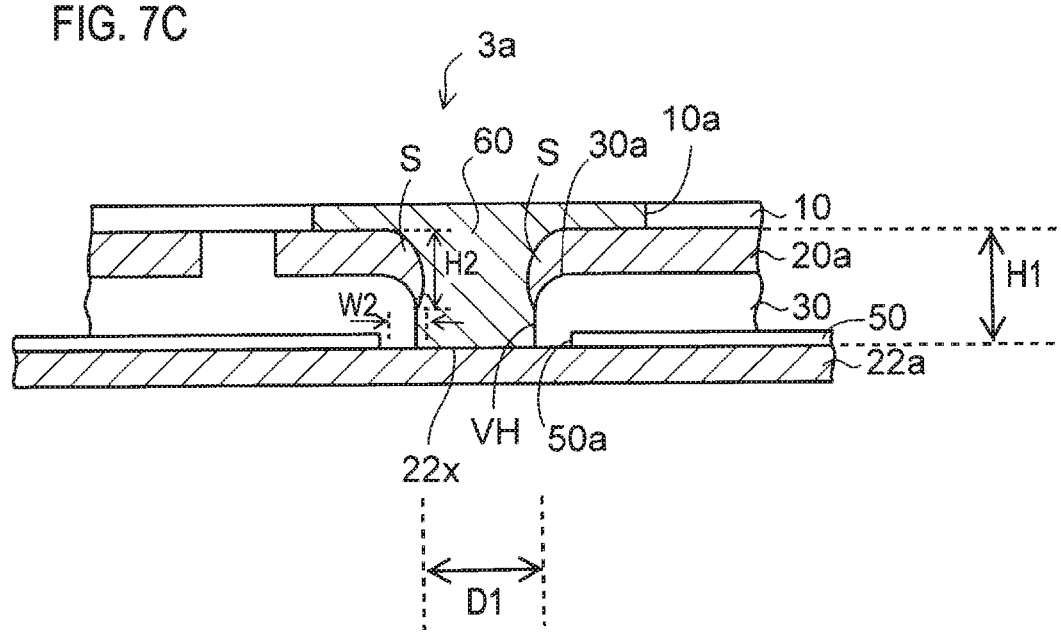

Subsequently, as shown in FIG. 7C, a metal-plated layer 60 is formed from bottom surface of the via hole VH towards the upper side by the electrolytic plating where the metal layer 22a is used as a power feeding path for plating. The metal-plated layer 60 is preferably formed of copper. However, a variety of metals for wiring may also be used.

In the first exemplary embodiment, the droop portions S of the metal layer 20a are arranged at the upper end-side of the via hole VH. For this reason, when forming the metal-plated layer 60 from the bottom surface of the via hole VH toward the upper side, the metal-plated layer 60 is securely connected to the droop portions S of the metal layer 20a with high reliability.

In this way, the connection part 22x of the metal layer 22a and the droop portions S of the metal layer 20a are connected to each other by the metal-plated layer 60.

Also, as described above in the preliminary matters, when the entire metal layer 20a having a large area is exposed, the plating may be little made at a point of time at which the metal-plated layer 60 is connected to the metal layer 20a.

However, in the first exemplary embodiment, as described above, the insulating layer 10 is formed on the metal layer 20a, and the opening 10a of the insulating layer 10 is arranged above the via hole VH and the surrounding region thereof. For this reason, since the upper surface of the metal layer 20a is covered by the insulating layer 10 except for the opening 10a, an exposed area of the metal layer 20a is considerably reduced.

Therefore, even though the metal-plated layer 60 in the via hole VH is connected to the metal layer 20a, an area of the power feeding for plating is just a little increased. For this reason, a problem that a current density per unit area of the electrolytic plating sharply decreases and the plating rate is extremely lowered does not occur.

As a result, even after the metal-plated layer 60 in the via hole VH is connected to the metal layer 20a, the metal-plated layer 60 is formed on the upper surface of the metal layer 20a in the opening 10a of the insulating layer 10.

In this way, the metal-plated layer 60 is securely filled from the via hole VH to the opening 10a of the insulating layer 10. The upper surface of the metal-plated layer 60 and the upper surface of the insulating layer 10 become flush with each other, so that it is possible to secure the flatness of the upper surface-side.

By the above processes, as shown in FIG. 7C, one first unit base material 3a for establishing an inductor device is manufactured.

For example, in a case where a height H1 of the metal-plated layer 60 from the bottom surface of the via hole VH to the upper surface of the metal layer 20a is set to 80 µm (a height of the via hole VH is set to 50 µm and a height of the metal layer 20a is set to 30 µm) and a diameter D1 of the metal-plated layer 60 (in other words, the diameter of the via hole VH) is set to 150 µm, a size of the droop portion S is set to 30 µm in a planar direction (W2) which is substantially 20% of the diameter D1 of the metal-plated layer 60 and set to 15 μm in a height direction (H2) which is substantially 20% of the height H1 of the metal-plated layer 60.

Subsequently, a method of stacking the same unit base material as the first unit base material 3a of FIG. 7C to manufacture an inductor device is described.

Figure 8:
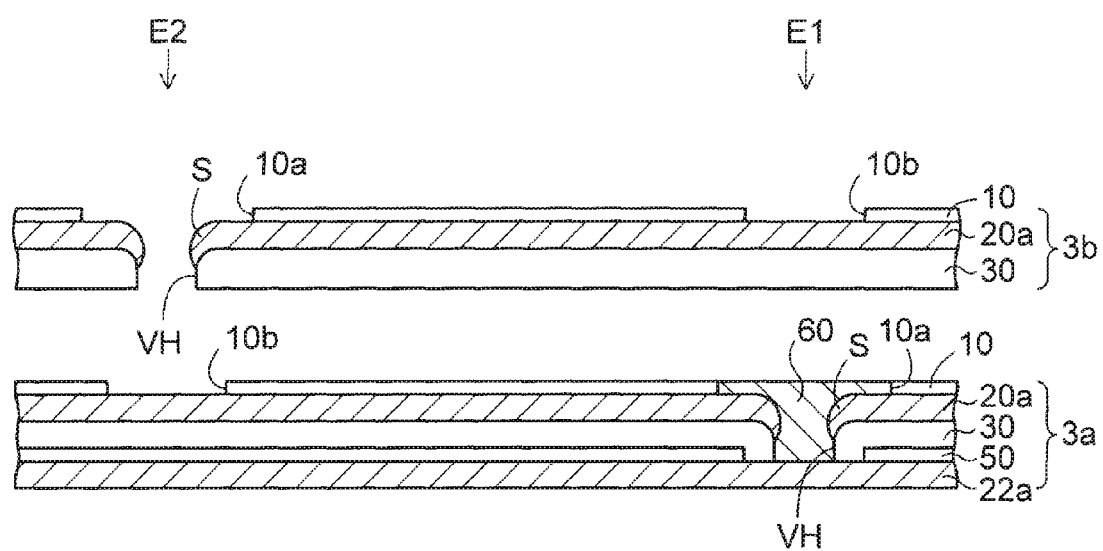
FIG. 8 is a sectional view depicting the manufacturing method of the inductor device according to the first exemplary embodiment (6 thereof).

FIG. 8 depicts an entire shape of the first unit base material 3a of FIG. 7C. In a sectional view of FIG. 8, a section at a different place from the sectional view of FIG. 7C is pictorially shown.

As shown in FIG. 8, in the first unit base material 3a, a pattern of the metal layer 20a connected to the metal-plated layer 60 in the via hole VH at one end-side E1 extends to the other end-side E2. At the other end-side E2 of the insulating layer 10, an opening 10b for connection is formed on the connection part of the metal layer 20a.

Also, a second unit base material 3b to be stacked on the first unit base material 3a is prepared. In the second unit base material 3b, the insulating layer 10 is formed on the metal layer 20a, and the insulating layer 30 is formed on the lower surface of the metal layer 20a.

Also, in the second unit base material 3b, the via hole VH is arranged at the other end-side E2, and the droop portions S of the metal layer 20a are formed at the upper end-side of the via hole VH.

In the example of FIG. 8, for easy understanding of the description, one end-side E1 and the other end-side E2 are shown. However, it is sufficient when the via hole VH of the first unit base material 3a and the via hole VH of the second unit base material 3b are arranged at different positions.

Also, in the second unit base material 3b, the opening 10a of the insulating layer 10 is formed above the via hole VH and the surrounding region thereof. Also, the opening 10b for connection of the insulating layer 10 is formed at one end-side E1.

The second unit base material 3b is manufactured by peeling off the carrier film 12 from the stacked member of FIG. 6B.

The opening 10b for connection of the first unit base material 3a is arranged to correspond to the via hole VH and surrounding region thereof of the second unit base material 3b.

Like this, the second unit base material 3b has a structure where the insulating layer 50, the metal layer 22a and the metal-plated layer 60 are omitted from the first unit base material 3a and the via hole VH is arranged at the opposite side.

Figure 9A:
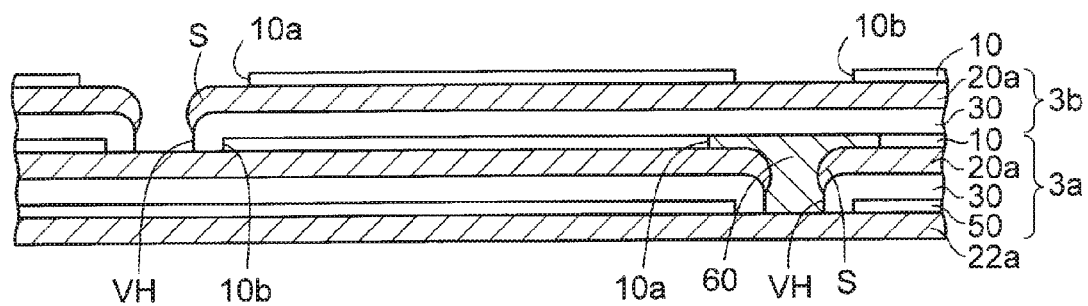
FIGS. 9A and 9B are sectional views depicting the manufacturing method of the inductor device according to the first exemplary embodiment (7 thereof).

As shown in FIG. 9A, the second unit base material 3b is stacked on the first unit base material 3a. The upper insulating layer 10 of the first unit base material 3a and the lower insulating layer 30 of the second unit base material 3b are bonded to each other, so that both the insulating layers are fixed.

At this time, the via hole VH of the second unit base material 3b is arranged on the metal layer 20a in the opening 10b for connection of the insulating layer 10 of the first unit base material 3a.

Figure 9B:
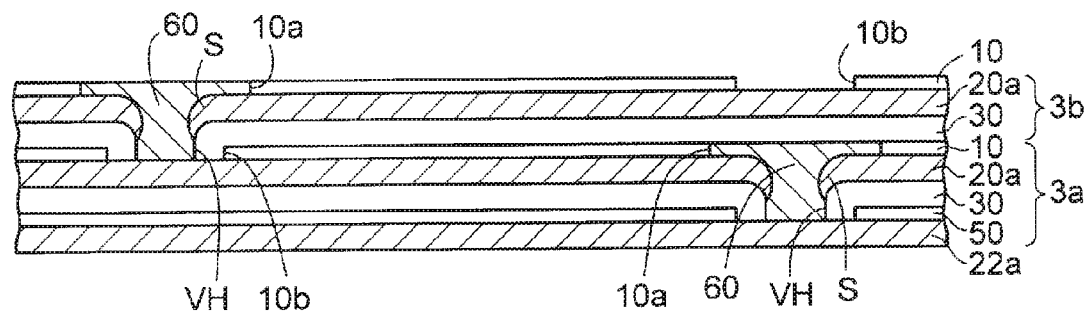

Subsequently, as shown in FIG. 9B, the electrolytic plating is performed with the metal layer 22a, the metal-plated layer 60 and the metal layer 20a of the first unit base material 3a being used as a power feeding path for plating. Thereby, like the process of FIG. 7C, the metal-plated layer 60 is formed from the bottom surface toward the upper side in the via hole VH of the second unit base material 3b. The metal layer 20a of the first unit base material 3a is connected to the metal layer 20a of the second unit base material 3b by the metal-plated layer 60.

Also in this process, the upper surface of the metal-plated layer 60 formed in the via hole VH of the second unit base material 3b is flush with the upper surface of the insulating layer 10, so that a flat surface is obtained.

Figure 10:
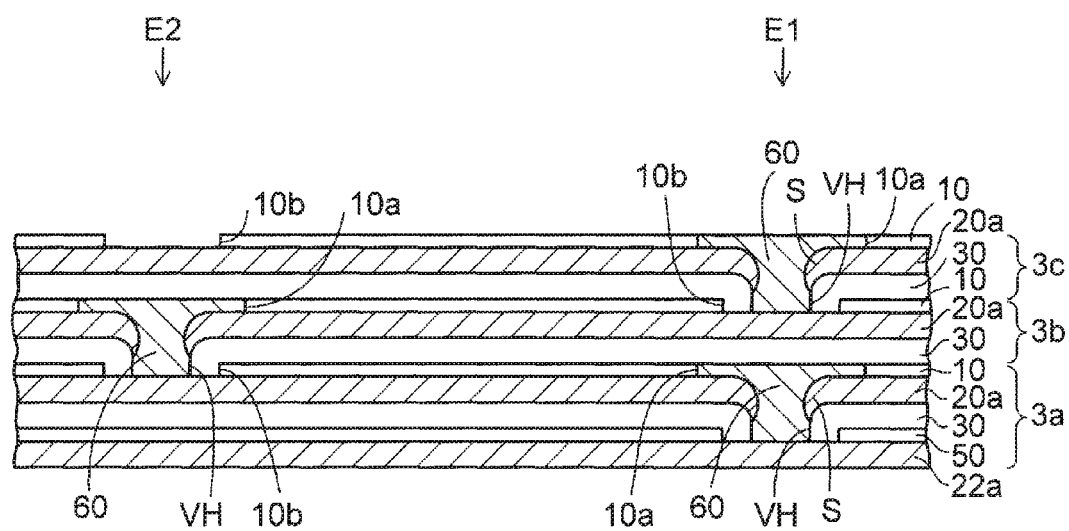
FIG. 10 is a sectional view depicting the manufacturing method of the inductor device according to the first exemplary embodiment (8 thereof).

Then, as shown in FIG. 10, a third unit base material 3c that is reverse to the second unit base material 3b and the via hole VH is formed at one end-side E1 is prepared. A layer structure of the third unit base material 3c is the same as the second unit base material 3b.

Then, the third unit base material 3c is stacked on the second unit base material 3b so that the via hole VH of the third unit base material 3c is arranged on the metal layer 20a in the opening 10b for connection of the insulating layer 10 of the second unit base material 3b.

Also, like the process of FIG. 9B, the metal-plated layer 60 is formed in the via hole VH of the third unit base material 3c by the electrolytic plating where the metal layer 20a of the second unit base material 3b is used as a power feeding path for plating.

Thereby, the metal layer 20a of the second unit base material 3b is connected to the metal layer 20a of the third unit base material 3c via the metal-plated layer 60.

Figure 11:
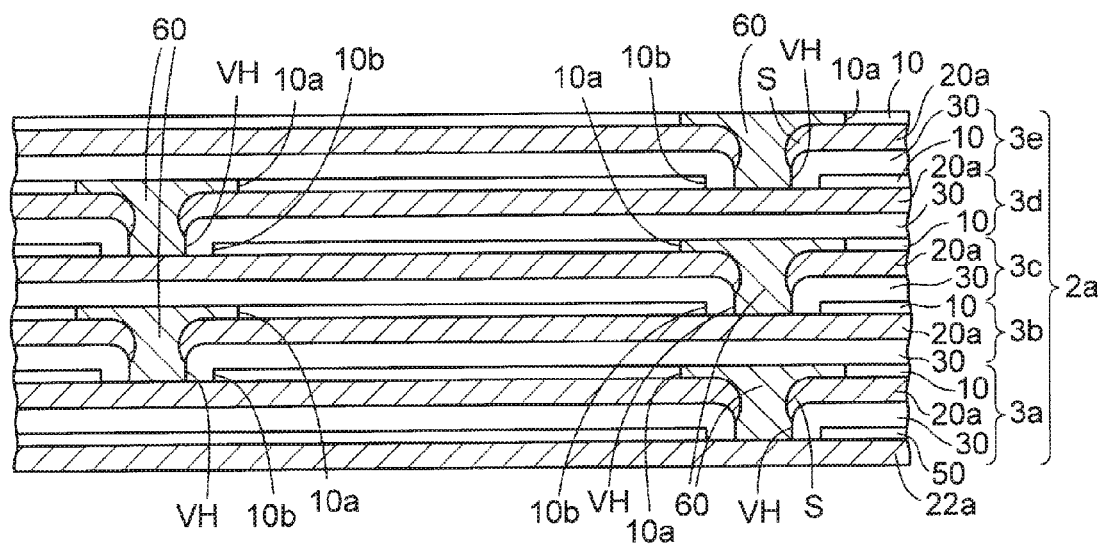
FIG. 11 is a sectional view depicting the manufacturing method of the inductor device according to the first exemplary embodiment (9 thereof).

Also, as shown in FIG. 11, a fourth unit base material 3d having the same structure as the second unit base material 3b is prepared. Then, like the stack of the second unit base material 3b, after stacking the fourth unit base material 3d on the third unit base material 3c, the metal-plated layer 60 is formed in the via hole VH of the fourth unit base material 3d.

Also, as shown in FIG. 11, a fifth unit base material 3e having the same structure as the third unit base material 3c is prepared. Then, like the stack of the third unit base material 3c, after stacking the fifth unit base material 3e on the fourth unit base material 3d, the metal-plated layer 60 is formed in the via hole VH of the fifth unit base material 3e.

In this way, a stacked unit base material 2a where the first to fifth unit base materials 3a to 3e are stacked is obtained.

Then, as shown in FIG. 12, a central portion of the stacked unit base material 2a is perforated to form an opening 3x. Also, an outward appearance of the stacked unit base material 2a is processed and trimmed. The opening 3x has a rectangular or circular shape, for example, as seen from a plan view.

The opening 3x is formed at the central portion of the stacked unit base material 2a, so that an unnecessary part of the pattern of each of the stacked metal layers 20a, 22a is removed and a coil pattern of a design specification is formed.

In this way, metal layers 20, 22 functioning as coils of the first to fifth unit base materials 3a to 3e are obtained. For example, the metal layers 20, 22 are stacked to have a spirally shaped pattern in a surrounding region of the opening 3x, as seen from a plan view.

Also, cut surfaces of the stacked metal layers 20, 22 are exposed in line vertically on an inner surface of the opening 3x of the stacked unit base material 2a.

Then, as shown in FIG. 13, an insulating layer 70 is selectively formed on the upper and lower surfaces of the stacked unit base material 2a, outer peripheral surfaces and the metal layers 20, 22 exposed from the inner surface of the opening 3x. In FIG. 13, an electrodeposition resist is used as the insulating layer 70.

Alternatively, the insulating layer may be formed by coating resin on the upper and lower surfaces of the stacked unit base material 2a, the outer peripheral surfaces and the entire inner surface of the opening 3x by deep coating, spin coating or spray coating.

Thereby, a stacked coil member 2 having the opening 3x penetrating the central portion thereof in a thickness direction is obtained.

Also, as shown in FIG. 14, raw material powders of a magnetic body are put in a mold and are subjected to pressurization molding, so that the opening 3x and entire outer surface of the stacked coil member 2 shown in FIG. 13 are sealed with a magnetic body 72. Then, external terminals (not shown), which are to be connected to one end portions and other end portions of the stacked metal layers 20, 22, are provided.

By the above processes, an inductor device 1 of the first exemplary embodiment is obtained.

As shown in FIG. 14, the inductor device 1 of the first exemplary embodiment has the stacked coil member 2 having the opening 3x provided at the central portion. The stacked coil member 2 has the first unit base material 3a at the lowest part.

As shown in a partially enlarged sectional view of FIG. 14, the first unit base material 3a has the insulating layer 30 configured to function as an adhesive layer and the insulating layer 30 is formed with the via hole VH penetrating in the thickness direction. The via hole VH is formed at one end-side E1 of the insulating layer 30. An example of the first insulating layer is the insulating layer 30 of the first unit base material 3a. Also, an example of the first via hole is the via hole VH of the first unit base material 3a.

On the insulating layer 30, the metal layer 20 is formed. The droop portions S of the metal layer 20 are arranged at the upper end-side of the via hole VH. The upper end-side of the via hole VH is configured as the convex curved surface 30a, and the droop portions S of the metal layer 20 cover the convex curved surface 30a of the insulating layer 30. An example of the first metal layer is the metal layer 20 of the first unit base material 3a.

Also, the insulating layer 10 having the opening 10a arranged above the via hole VH and above the surrounding region thereof is formed on the metal layer 20. An example of the second insulating layer is the insulating layer 10 of the first unit base material 3a.

Also, under the insulating layer 30, the metal layer 22 is bonded via the insulating layer 50. The metal layer 22 is formed to block the via hole VH. The connection part 22x of the metal layer 22 is exposed to the bottom surface of the via hole VH. An example of the second metal layer is the metal layer 22 of the first unit base material 3a.

In the via hole VH, the metal-plated layer 60 configured to connect the metal layer 22 and the droop portions S of the metal layer 20 is filled. The metal-plated layer 60 is formed within the region ranging from the via hole VH to the opening 10a of the insulating layer 10, and is formed to cover the upper surface of the metal layer 20 in the opening 10a. An example of the first metal-plated layer is the metal-plated layer 60 of the first unit base material 3a.

The upper surface of the metal-plated layer 60 and the upper surface of the insulating layer 10 are flush with each other, so that the upper surface-side of the first unit base material 3a is configured as a flat surface.

The thermal stress is generated in the inductor device 1 when reflow-heating solders of the inductor device 1 for connection to a mount substrate, when actually using the inductor device 1, or the like.

In the first unit base material 3a for establishing the inductor device 1 of the first exemplary embodiment, the upper end-side of the via hole VH is configured as the convex curved surface 30a, and the droop portions S of the metal layer 20 cover the convex curved surface 30a.

Also, since the metal-plated layer 60 is connected to the side surfaces including the droop portions S of the metal layer 20 and the surrounding upper surface, it is possible to increase a contact area between the metal-plated layer 60 and the metal layer 20.

For this reason, even when the thermal stress is generated, the stress to be concentrated on the part of the insulating layer 30 at the upper end of the via hole VH is relieved, so that it is possible to prevent a crack from being generated from the upper end of the via hole VH into the insulating layer 30.

In this way, the inductor device 1 of the first exemplary embodiment is robust to the thermal stress, so that it is possible to improve the reliability of the via connection.

Also, since the droop portions S of the metal layer 20 are arranged at the upper end-side of the via hole VH, when forming the metal-plated layer 60 from the bottom surface of the via hole VH toward the upper side, the metal-plated layer 60 is securely connected to the droop portions S of the metal layer 20 with high reliability.

Also, as described above in the manufacturing method, the upper surface of the metal layer 20 is covered with the insulating layer 10, except for the openings 10a of the insulating layer 10.

For this reason, when forming the metal-plated layer 60 in the via holes VH, even though the metal-plated layer 60 is connected to the metal layer 20, a problem that the plating rate is extremely lowered does not occur.

As a result, the upper surface of the metal layer 20 in the openings 10a of the insulating layer 10 is formed with the metal-plated layer 60, so that the flatness of the upper surface-side can be secured.

Also, at the other end-side E2 of the first unit base material 3a, the opening 10b for connection is formed in the insulating layer 10 on the connection part 20x of the metal layer 20.

On the first unit base material 3a, the second unit base material 3b is stacked. The second unit base material 3b has such a structure that the insulating layer 50 and the metal layer 22 are omitted from the structure of the first unit base material 3a, and the surrounding structure of the via hole VH is the same as the first unit base material 3a. In the second unit base material 3b, the via hole VH is arranged at the other end-side E2.

The via hole VH of the second unit base material 3b is arranged on the metal layer 20 in the opening 10b for connection of the insulating layer 10 of the first unit base material 3a. Likewise, the via hole VH of the second unit base material 3b is formed therein with the metal-plated layer 60 configured to connect the metal layer 20 of the first unit base material 3a and the metal layer 20 of the second unit base material 3b each other.

An example of the third insulating layer is the insulating layer 30 of the second unit base material 3b. An example of the second via hole is the via hole VH of the second unit base material 3b. Also, an example of the third metal layer is the metal layer 20 of the second unit base material 3b. Also, an example of the second metal-plated layer is the metal-plated layer 60 of the second unit base material 3b.

Also, the third unit base material 3c is stacked on the second unit base material 3b. The third unit base material 3c has substantially the same structure as the second unit base material 3b. However, the via hole VH is arranged at one end-side E1.

The via hole VH of the third unit base material 3c is arranged on the metal layer 20 in the opening 10b for connection of the insulating layer 10 of the second unit base material 3b. Likewise, the via hole VH of the third unit base material 3c is formed therein with the metal-plated layer 60 configured to connect the metal layer 20 of the second unit base material 3b and the metal layer 20 of the third unit base material 3c each other.

Likewise, the fourth unit base material 3d is stacked on the third unit base material 3c. The fourth unit base material 3d has the same structure as the second unit base material 3b, and the via hole VH is arranged at the other end-side E2.

The via hole VH of the fourth unit base material 3d is arranged on the metal layer 20 in the opening 10b for connection of the insulating layer 10 of the third unit base material 3c. Likewise, the via hole VH of the fourth unit base material 3d is formed therein with the metal-plated layer 60 configured to connect the metal layer 20 of the third unit base material 3c and the metal layer 20 of the fourth unit base material 3d.

Likewise, the fifth unit base material 3e is stacked on the fourth unit base material 3d. The fifth unit base material 3e has the same structure as the third unit base material 3c, and the via hole VH is arranged at one end-side E1.

The via hole VH of the fifth unit base material 3e is arranged on the metal layer 20 in the opening 10b for connection of the insulating layer 10 of the fourth unit base material 3d. Likewise, the via hole VH of the fifth unit base material 3e is formed therein with the metal-plated layer 60 configured to connect the metal layer 20 of the fourth unit base material 3d and the metal layer 20 of the fifth unit base material 3e each other.

The central portions of the first to fifth stacked unit base materials 3a to 3e are formed with the opening 3x penetrating the region ranging from the upper surface to the lower surface, so that the stacked coil member 2 is established. Also, the insulating layer 70 is selectively formed on the upper and lower surfaces of the stacked coil member 2, the outer peripheral surfaces and the metal layers 20, 22 exposed from the inner surface of the opening 3x.

Also, the upper and lower surfaces of the stacked coil member 2, the outer peripheral surfaces and the inner surface of the opening 3x are sealed with the magnetic body 72.

In this way, the inductor device 1 of the first exemplary embodiment has a structure where the respective metal layers 20, 22 of the stacked coil member 2 are connected to each other via the metal-plated layer 60 in the via holes VH. The respective via holes VH of the first to fifth unit base materials 3a to 3e are preferably arranged on the connection parts of the lower metal layers 20, 22 and may be arranged at arbitrary positions.

In the inductor device 1, the opening 3x is provided at the central portion of the stacked coil member 2, and not only the outer surface of the stacked coil member 2 but also the inner surface of the opening 3x is sealed with the magnetic body 72.

For this reason, as compared to a configuration where the opening 3x is not formed, more parts of the stacked coil member 2 is sealed with the magnetic body 72, so that the inductance can be increased. The inductor device 1 is used for a voltage conversion circuit of an electronic device, for example.

As described above, in the inductor device 1 of the first exemplary embodiment, the upper end-side of each via hole VH of the stacked coil member 2 is configured as the convex curved surface 30a, and the convex curved surface 30a is covered by the droop portions S of the metal layer 20.

For this reason, even when the thermal stress is generated, the stress to be concentrated on the upper end of each via hole VH is relieved, so that the crack is prevented from being generated from the upper end of the via hole VH into the insulating layer 30. Thereby, the reliability of the via connection in the inductor device 1 can be improved.

Second Exemplary Embodiment

Figure 15:
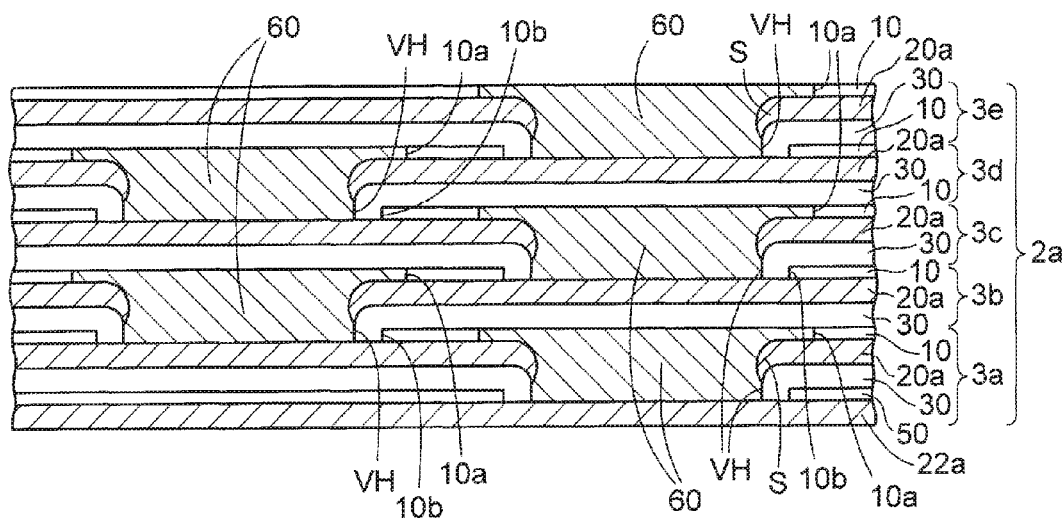
FIG. 15 is a sectional view depicting a manufacturing method of an inductor device according to a second exemplary embodiment (1 thereof).
Figure 16:
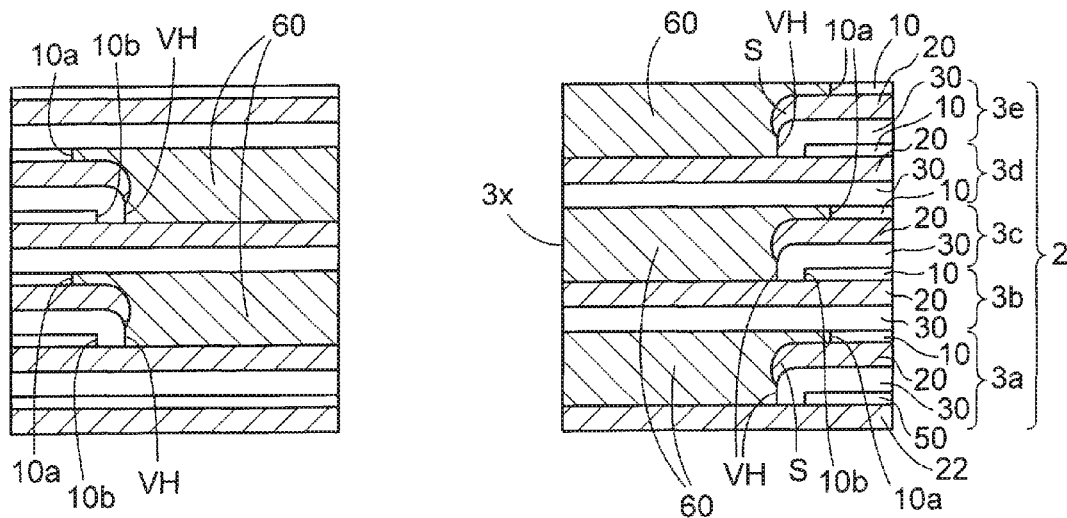
FIG. 16 is a sectional view depicting the manufacturing method of the inductor device according to the second exemplary embodiment (2 thereof).
Figure 17:
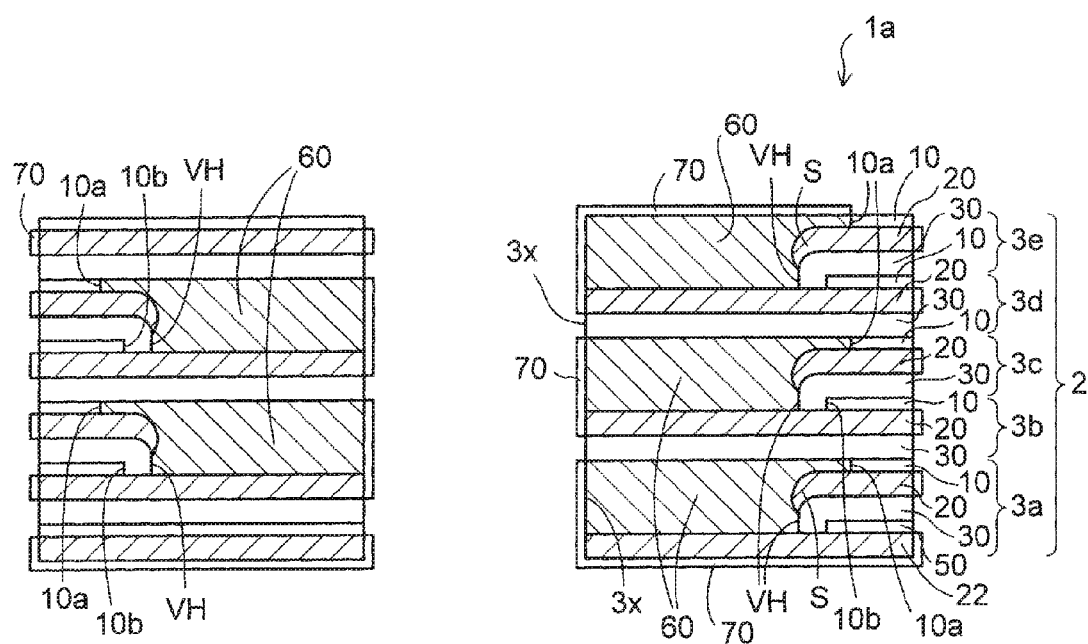
FIG. 17 is a sectional view depicting the manufacturing method of the inductor device according to the second exemplary embodiment (3 thereof).
Figure 18:
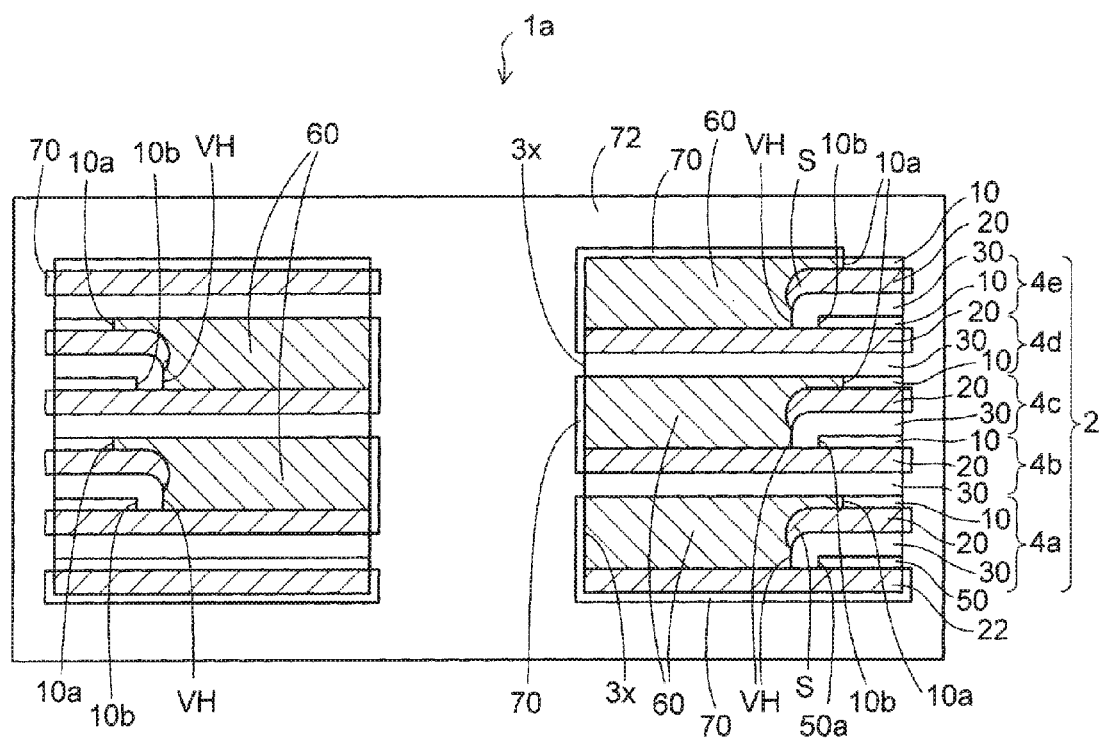
FIG. 18 is a sectional view depicting an inductor device according to the second exemplary embodiment.

FIGS. 15 to 17 depict a method of manufacturing an inductor device of a second exemplary embodiment, and FIG. 18 depicts an inductor device of the second exemplary embodiment. In the second exemplary embodiment, the same processes and elements as the first exemplary embodiment are denoted with the same reference numerals, and the detailed descriptions thereof are omitted.

In the manufacturing method of the inductor device of the second exemplary embodiment, as exemplified in FIG. 15, each via hole VH of the first to fifth unit base materials 3a to 3e in the stacked unit base material 2a of the first exemplary embodiment shown in FIG. 11 is formed to extend from one end-side to the central portion, for example, to have an elongated shape.

When forming the opening in the stacked unit base material 2a, the via hole is preferably arranged so that the opening is cut in the via hole.

Then, as shown in FIG. 16, the opening 3x is formed by perforating the central portions including the inner portions of the respective via holes VH of the stacked unit base material 2a of FIG. 15.

Thereby, the side surfaces of the metal-plated layer 60 in the via holes VH of the first to fifth unit base materials 3a to 3e are exposed to the inner surface of the opening 3x. Also, an unnecessary part of the pattern of each of the metal layers 20a, 22a is removed, so that the metal layers 20, 22 functioning as coils are obtained.

Subsequently, as shown in FIG. 17, like the process of the first exemplary embodiment shown in FIG. 13, the insulating layer 70 is selectively formed on the upper and lower surfaces of the stacked coil member 2, the outer peripheral surfaces, the metal layers 20, 22 exposed from the inner surface of the opening 3x and the metal-plated layer 60. Thereby, the stacked coil member 2 is obtained.

Thereafter, as shown in FIG. 18, like the first exemplary embodiment shown in FIG. 14, the opening 3x of the stacked coil member 2 shown in FIG. 17 and the entire outer surface are sealed with the magnetic body 72.

By the above processes, an inductor device 1a of the second exemplary embodiment is manufactured. In the inductor device 1a of the second exemplary embodiment, like the inductor device 1 (FIG. 14) of the first exemplary embodiment, the metal layers 20, 22 of the stacked coil member 2 are connected to each other via the metal-plated layer 60 in the via holes VH.

Each via hole VH of the inductor device 1a of the second exemplary embodiment is formed in such a way that an inner side surface is opened.

Like the first exemplary embodiment, the droop portions of the metal layer 20 are arranged at the upper end-side of each via hole VH of the stacked coil member 2, and the metal-plated layer 60 is formed in each via hole VH.

The inductor device 1a of the second exemplary embodiment has the same effects as the first exemplary embodiment.

Also, in the second exemplary embodiment, the structure where the side surfaces of the metal-plated layer 60 in the via holes VH is exposed to the inner surface of the opening 3x is adopted, so that it is possible to widen a width of the via conductor. Thereby, it is possible to reduce an electrical resistance of the via connection and to improve the reliability of the electrical connection.

This disclosure further encompasses various exemplary embodiments, for example, described below.

1. A method of manufacturing an inductor device, comprising:
preparing a stacked base material having a first metal layer and a first insulating layer formed on a lower surface of the first metal layer;
punching the stacked base material by a punch to form a first via hole in the first insulating layer and to obtain a droop portion of the first metal layer at an upper end-side of the first via hole;
forming a second metal layer having a first connection part exposed to a bottom surface of the first via hole, on a lower surface the first insulating layer; and
forming a first metal-plated layer configured to connect the first connection part and the droop portion of the first metal layer in the first via hole by an electrolytic plating where the second metal layer is used as a power feeding path for plating.

2. The method according to claim 1, wherein in the obtaining the droop portion of the first metal layer, an upper end-side of a side surface of the first via hole is configured as a convex curved surface and the droop portion of the first metal layer covers the convex curved surface.

3. The method according to claim 1 or 2, wherein in the preparing the stacked base material, the stacked base material comprises a second insulating layer formed on the first metal layer and having an opening arranged above the first via hole and on the first metal layer around the first via hole, and
wherein in the forming the first metal-plated layer, the first metal-plated layer is formed over a region ranging from the first via hole to the first metal layer in the opening of the second insulating layer.

4. The method according to claim 3, wherein in the forming the first metal-plated layer, an upper surface of the first metal-plated layer and an upper surface of the second insulating layer are flush with each other.

5. The method according to claim 3 or 4, wherein in the preparing the stacked base material, the second insulating layer of the stacked base material has an opening for connection arranged on a second connection part of the first metal layer, and
the method further comprises, after the forming the first metal-plated layer;
preparing a unit base material comprising a third insulating layer having a second via hole and a third metal layer formed on the third insulating layer and having a droop portion at an upper end-side of the second via hole;
stacking the third insulating layer of the unit base material on the second insulating layer so that the second via hole of the unit base material is arranged on the first metal layer in the opening for connection of the second insulating layer; and
forming a second metal-plated layer configured to connect the first metal layer and the droop portion of the third metal layer in the second via hole by an electrolytic plating where the first metal layer is used as a power feeding path for plating.

The invention claimed is:

1. An inductor device comprising:
a first insulating layer having a first via hole;
a first metal layer formed on an upper surface of the first insulating layer and the first metal layer having a droop portion at an upper end-side of the first via hole, wherein a tip end of the droop portion extends into the via hole;
a second metal layer formed on a lower surface of the first insulating layer and having a first connection part exposed to a bottom surface of the first via hole; and
a first metal-plated layer formed in the first via hole and configured to connect the first connection part and the droop portion of the first metal layer.

2. The inductor device according to claim 1, wherein an upper end-side of a side surface of the first via hole is configured as a convex curved surface, and the droop portion of the first metal layer covers the convex curved surface.

3. The inductor device according to claim 1, further comprising:
a second insulating layer formed on the first metal layer and having an opening arranged above the first via hole and on the first metal layer around the first via hole,
wherein the first metal-plated layer is formed over a region ranging from the first via hole to the first metal layer in the opening of the second insulating layer.

4. The inductor device according to claim 3, wherein an upper surface of the first metal-plated layer and an upper surface of the second insulating layer are flush with each other.

5. The inductor device according to claim 3, wherein the first metal layer has a second connection part, and
the inductor device further comprises:
an opening for connection formed in the second insulating layer and arranged on the second connection part;
a third insulating layer formed on the second insulating layer and in the opening for connection;
a second via hole formed in the third insulating layer and extending to the second connection part;
a third metal layer formed on the third insulating layer and having a droop portion at an upper end-side of the second via hole; and
a second metal-plated layer formed in the second via hole and configured to connect the second connection part of the first metal layer and the droop portion of the third metal layer.

6. The inductor device according to claim 1, wherein the first metal layer is a layer that is distinct from the first metal-plated layer.

7. The inductor device according to claim 1, wherein a distance from the bottom surface of the first via hole to the tip end of the droop portion is shorter than a thickness from the upper surface of the first insulating layer to the lower surface of the first insulating layer.

8. An inductor device comprising:
a first insulating layer having a first via hole;
a first metal layer formed on an upper surface of the first insulating layer and having a droop portion at an upper end-side of the first via hole;
a second metal layer formed on a lower surface of the first insulating layer and having a first connection part exposed to a bottom surface of the first via hole; and
a first metal-plated layer formed in the first via hole and configured to connect the first connection part and the droop portion of the first metal layer,
wherein an upper end-side of a side surface of the first via hole is configured as a convex curved surface, and the droop portion of the first metal layer covers an entirety of the convex curved surface.

* * * * *